United States Patent
Shin et al.

(10) Patent No.: US 10,886,352 B2
(45) Date of Patent: Jan. 5, 2021

(54) PIXEL AND DISPLAY DEVICE INCLUDING THE SAME

(71) Applicant: Samsung Display Co., Ltd., Yongin (KR)

(72) Inventors: Young Jun Shin, Seongnam-si (KR); Hee Kyung Kim, Busan (KR); Dae Woo Lee, Hwaseong-si (KR); Yun-Mo Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 256 days.

(21) Appl. No.: 14/932,838

(22) Filed: Nov. 4, 2015

(65) Prior Publication Data
US 2016/0293686 A1    Oct. 6, 2016

(30) Foreign Application Priority Data

Mar. 31, 2015  (KR) .................. 10-2015-0045415

(51) Int. Cl.
| | | |
|---|---|---|
| *G09G 3/32* | (2016.01) | |
| *H01L 27/32* | (2006.01) | |
| *H01L 51/52* | (2006.01) | |
| *G09G 3/3233* | (2016.01) | |

(52) U.S. Cl.
CPC ...... *H01L 27/3269* (2013.01); *H01L 51/5271* (2013.01); *G09G 3/3233* (2013.01); *G09G 2360/148* (2013.01); *H01L 27/3227* (2013.01); *H01L 51/5284* (2013.01)

(58) Field of Classification Search
None
See application file for complete search history.

(56) References Cited

U.S. PATENT DOCUMENTS

| | | | |
|---|---|---|---|
| 9,720,141 B1* | 8/2017 | Cheng | G02B 1/18 |
| 2002/0044208 A1* | 4/2002 | Yamazaki | H01L 27/14678 348/272 |
| 2004/0075115 A1* | 4/2004 | Fery | H01L 51/524 257/200 |
| 2007/0063957 A1* | 3/2007 | Awakura | G02F 1/13318 345/98 |
| 2007/0229452 A1* | 10/2007 | Sano | G01J 1/4204 345/102 |
| 2007/0241998 A1* | 10/2007 | Fish | H01L 27/3269 345/76 |
| 2008/0164481 A1* | 7/2008 | Tai | H01L 31/182 257/81 |
| 2008/0170047 A1* | 7/2008 | Sato | G06F 3/0412 345/175 |

(Continued)

FOREIGN PATENT DOCUMENTS

| | | |
|---|---|---|
| KR | 10-2012-0071264 A | 7/2012 |
| KR | 10-2012-0098740 A | 9/2012 |
| KR | 10-2014-0055992 A | 5/2014 |

*Primary Examiner* — Jose R Soto Lopez
(74) *Attorney, Agent, or Firm* — F. Chau & Associates, LLC

(57) ABSTRACT

A pixel and a display device including the same are disclosed. In one aspect, the pixel includes an organic light-emitting diode (OLED) and a reflection layer facing the OLED and configured to reflect light emitted from the OLED. The pixel also includes a photosensor configured to measure luminance of the reflected light. The photosensor is placed on a rear side of the OLED.

16 Claims, 3 Drawing Sheets

(56) References Cited

U.S. PATENT DOCUMENTS

| | | | | |
|---|---|---|---|---|
| 2010/0128010 A1* | 5/2010 | Katoh | G09G 3/3406 | 345/207 |
| 2010/0201275 A1* | 8/2010 | Cok | G06F 3/0412 | 315/158 |
| 2010/0245216 A1* | 9/2010 | Nakamura | H01L 27/3269 | 345/76 |
| 2010/0253660 A1* | 10/2010 | Hashimoto | G01J 1/42 | 345/207 |
| 2010/0289829 A1* | 11/2010 | Yamamoto | G09G 3/3233 | 345/690 |
| 2010/0289831 A1* | 11/2010 | Yamamoto | G09G 3/3233 | 345/690 |
| 2010/0308345 A1* | 12/2010 | Brown | H01L 31/153 | 257/82 |
| 2011/0164010 A1* | 7/2011 | Yamamoto | G09G 3/3233 | 345/207 |
| 2011/0164011 A1* | 7/2011 | Yamamoto | G09G 3/3233 | 345/207 |
| 2011/0165380 A1* | 7/2011 | Gahagan | C03C 3/085 | 428/156 |
| 2011/0176038 A1* | 7/2011 | Kurokawa | H01L 29/7869 | 348/294 |
| 2012/0262413 A1* | 10/2012 | Huang | G06F 3/042 | 345/174 |
| 2012/0313103 A1* | 12/2012 | Yamada | H01L 27/14623 | 257/66 |
| 2012/0327341 A1* | 12/2012 | Honda | G02F 1/133308 | 349/112 |
| 2013/0002145 A1* | 1/2013 | Hwang | G09G 3/36 | 315/158 |
| 2013/0099290 A1* | 4/2013 | Itoh | H01L 21/0243 | 257/225 |
| 2013/0222603 A1* | 8/2013 | Agranov | H04N 5/33 | 348/164 |
| 2013/0241891 A1* | 9/2013 | Usukura | G06F 3/0425 | 345/175 |
| 2013/0343087 A1 | 12/2013 | Huang | | |
| 2014/0009960 A1 | 1/2014 | Miyamoto et al. | | |
| 2014/0146094 A1* | 5/2014 | Koide | G09G 3/3648 | 345/690 |
| 2014/0152637 A1* | 6/2014 | Fujita | H05B 33/14 | 345/211 |
| 2014/0268590 A1* | 9/2014 | Kim | B05D 3/067 | 361/748 |
| 2014/0306869 A1* | 10/2014 | Fujita | C07F 15/0033 | 345/77 |
| 2014/0320553 A1* | 10/2014 | Eom | G09G 3/3208 | 345/690 |
| 2015/0014660 A1* | 1/2015 | Lee | H01L 51/5275 | 257/40 |
| 2015/0097820 A1* | 4/2015 | An | G09G 3/3208 | 345/207 |
| 2015/0111009 A1* | 4/2015 | Choi | G06F 3/0412 | 428/194 |
| 2015/0302793 A1* | 10/2015 | In | G09G 5/18 | 345/211 |
| 2015/0319869 A1* | 11/2015 | Kim | G06F 1/16 | 361/748 |
| 2016/0188119 A1* | 6/2016 | Ham | G02F 1/0131 | 345/175 |
| 2016/0233283 A1* | 8/2016 | Kim | H01L 27/3269 | |
| 2016/0260861 A1* | 9/2016 | Mazzillo | H01L 31/1013 | |
| 2019/0074333 A1* | 3/2019 | Rappoport | G06F 1/1686 | |
| 2019/0324535 A1* | 10/2019 | Tungare | A61F 4/00 | |

* cited by examiner

PIXEL AND DISPLAY DEVICE INCLUDING THE SAME

CROSS-REFERENCE TO RELATED APPLICATION

This application claims priority to and the benefit of Korean Patent Application No. 10-2015-0045415 filed in the Korean Intellectual Property Office on Mar. 31, 2015, the entire contents of which are incorporated herein by reference.

BACKGROUND

Field

The described technology generally relates to a pixel and a display device.

Description of the Related Technology

Currently known display devices employ technologies that can be classified, for example, as a liquid crystal display (LCD), a plasma display panel (PDP), an organic light-emitting diode (OLED) device, a field effect display (FED), and an electrophoretic display device.

In particular, an OLED device includes two electrodes and an organic emission layer positioned therebetween, and an electron injected from one electrode and a hole injected from the other electrode are coupled with each other in the organic emission layer to generate an exciton, and the exciton emits energy to emit light.

Since this device is self-luminant (it does not require a separate light source unlike an LCD), its thickness and weight thereof can be reduced. Further, since it has many desirable characteristics such as a wide color gamut, low power consumption, high luminance, and high refresh rate, OLED has received attention as a next-generation technology.

In an OLED device, pixels degrade over time, and it is necessary to correct for reduced light output. To this end, a photosensor receives light emitted by the pixel, and the light is analyzed and corrected as needed.

However, when the light emitted by the pixel is not transmitted to the photosensor, the deteriorated pixel may not be corrected.

The above information disclosed in this Background section is only to enhance the understanding of the background of the described technology, and therefore it may contain information that does not constitute the prior art that is already known in this country to a person of ordinary skill in the art.

SUMMARY OF CERTAIN INVENTIVE ASPECTS

One inventive aspect relates to a display device for correcting the degradation of pixels.

Another aspect is a pixel and a display device for amplifying light output to a rear side of the pixel.

Another aspect is a pixel and a display device for efficiently correcting degradation of an OLED.

Another aspect is a pixel including: an OLED; a reflection layer formed to face the OLED and to reflect light of the OLED; and a photosensor for measuring luminance of the reflected light, wherein the photosensor is provided on a rear side of the OLED.

The photosensor does not overlap the OLED.

The reflection layer amplifies an amount of light output to a rear side of the OLED.

The pixel includes an encapsulation glass and a black matrix provided on a lower portion of the encapsulation glass, and the photosensor is formed on a lower portion of the black matrix.

Another aspect is a display device including a plurality of pixels, wherein the respective pixels include an OLED, a reflection layer formed to face the OLED and to reflect light of the OLED, and a photosensor for measuring luminance of the reflected light; and the photosensor is provided on a rear side of the OLED and the photosensor does not overlap the OLED.

The photosensor does not overlap the OLED.

The reflection layer amplifies an amount of light output to a rear side of the OLED.

The pixel includes an encapsulation glass and a black matrix provided on a lower portion of the encapsulation glass, and the photosensor is formed on a lower portion of the black matrix.

The display device further includes: a data driver for generating a plurality of data signals according to a control signal; and a signal controller for generating the control signal, wherein the OLED emits light according to a driving current corresponding to the data signal, and the signal controller determines degradation of the OLED based upon a luminance value of the reflected light, and generates the control signal to correct an amount of light of the degraded OLED.

The pixel and the display device according to the exemplary embodiment have the effect of amplifying the light output to the rear side of the pixel.

The pixel and the display device according to the exemplary embodiment also have the effect of efficiently correcting degradation of the OLED.

Another aspect is a pixel comprising: an organic light-emitting diode (OLED); a reflection layer facing the OLED and configured to reflect light emitted from the OLED; and a photosensor configured to measure luminance of the reflected light, wherein the photosensor is placed on a rear side of the OLED.

In the above pixel, the photosensor does not overlap the OLED in the depth dimension of the pixel. In the above pixel, the reflection layer is configured to amplify an amount of light output to the rear side of the OLED. The above pixel further comprises an encapsulation glass and a black matrix placed on a lower portion of the encapsulation glass, wherein the photosensor is placed on a lower portion of the black matrix. In the above pixel, the photosensor partially overlaps the black matrix in the depth dimension of the pixel. In the above pixel, the photosensor is thicker than the black matrix. In the above pixel, the photosensor is thicker than the reflection layer. In the above pixel, the photosensor is thicker than the OLED. The above pixel further comprises a driving circuit layer formed below the OLED and formed over the photosensor. In the above pixel, the photosensor is configured to sense light emitted from the OLED and passing through the driving circuit layer. In the above pixel, the photosensor is thicker than the driving circuit layer.

Another aspect is a display device, comprising: a plurality of pixels, wherein each of the pixels includes: an organic light-emitting diode (OLED); a reflection layer facing the OLED and configured to reflect light emitted from the OLED; and a photo sensor configured to measure luminance of the reflected light, wherein the photosensor is placed on a rear side of the OLED.

In the above display device, the photosensor does not overlap the OLED in the depth dimension of the display device. In the above display device, the reflection layer is configured to amplify an amount of light output to the rear side of the OLED. In the above display device, the pixel includes a glass encapsulation glass and a black matrix placed on a lower portion of the glass encapsulation, and wherein the photosensor is placed on a lower portion of the black matrix. The above display device further comprises: a data driver configured to generate a plurality of data signals according to a control signal; and a signal controller configured to generate the control signal, wherein the OLED is configured to emit light according to a driving current corresponding to the data signals, and wherein the signal controller is further configured to determine degradation of the OLED based upon a luminance value of the reflected light, and generate the control signal to correct an amount of light of the degraded OLED. In the above display device, the photosensor partially overlaps the black matrix in the depth dimension of the pixel. The above display device further comprises a driving circuit layer formed below the OLED and formed over the photosensor, wherein the photosensor is configured to sense light emitted from the OLED and passing through the driving circuit layer.

Another aspect is a pixel comprising: a driving circuit layer including first and second surfaces opposing each other; an organic light-emitting diode (OLED) formed on the first surface of the driving circuit layer; a reflection layer formed over the OLED and configured to reflect light emitted from the OLED; and a photo sensor placed on the second surface of the driving circuit layer and configured to measure luminance of the reflected light, wherein the photo sensor and the OLED do not overlap each other in the depth dimension of the pixel.

The above pixel further comprises a black matrix formed over the reflection layer, wherein the black matrix and the reflection layer have substantially the same width.

DETAILED DESCRIPTION OF CERTAIN INVENTIVE EMBODIMENTS

Figure 1:
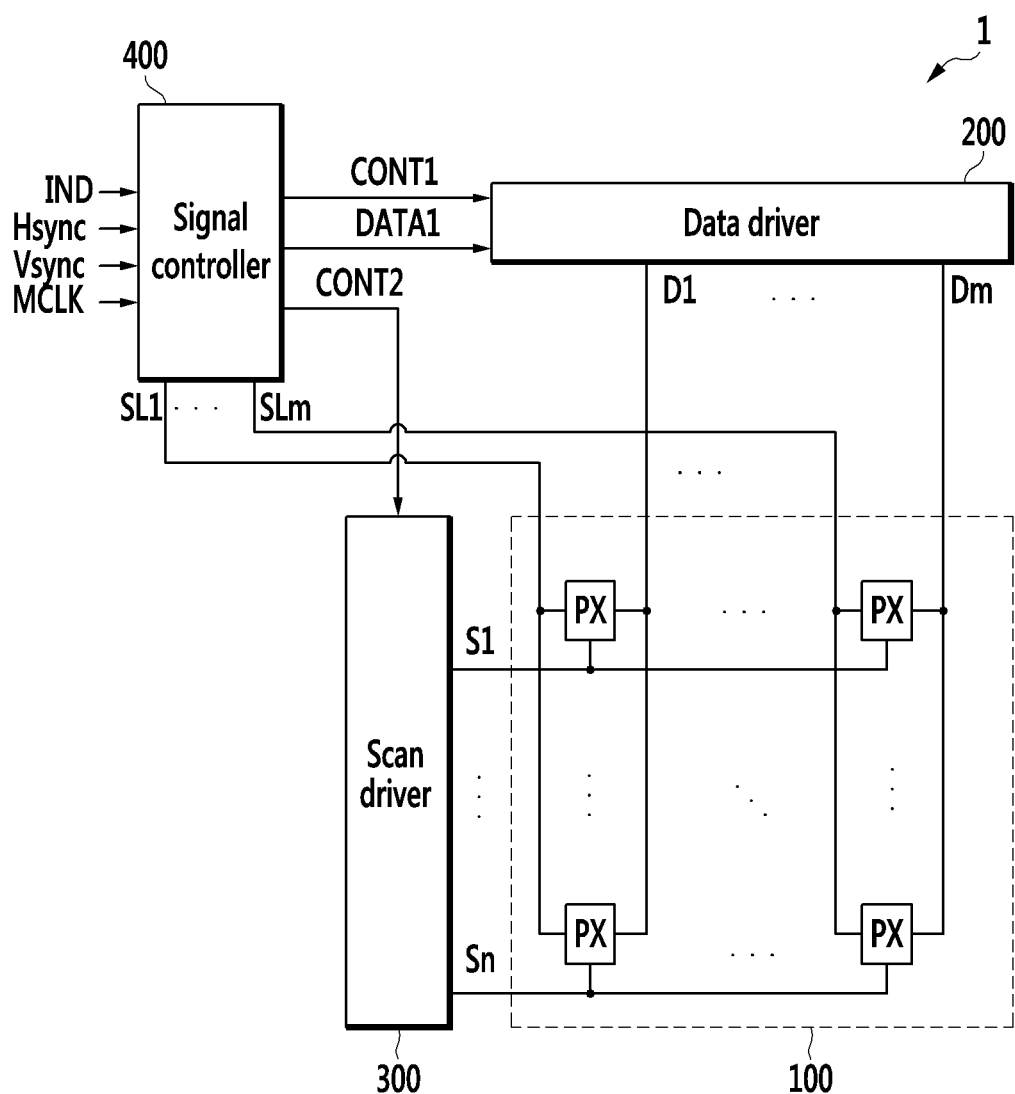
FIG. 1 shows a display device according to an exemplary embodiment.

Hereinafter, exemplary embodiments disclosed in the present specification will be described in detail with reference to the accompanying drawings. In the present specification, the same or similar components will be denoted by the same or similar reference numerals, and duplicate descriptions thereof will be omitted. The terms "module" and "unit" for components used in the following description are used only ease of description. Therefore, these terms do not have meanings or roles in and of themselves that would distinguish them from each other. In describing exemplary embodiments of the present specification, when it is determined that a detailed description of the well-known art associated with the present invention may obscure the gist of the present invention, such description will be omitted. The accompanying drawings are provided only in order to allow exemplary embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like, will be used only to describe various components, and are not interpreted as limiting these components. The terms are only used to differentiate one component from other components.

It is to be understood that when one component is referred to as being "connected" or "coupled" to another component, it may be connected or coupled directly to another component or there may be other intervening components. On the other hand, it is to be understood that when one component is referred to as being "connected or coupled directly" to another component, there are no other intervening components.

Singular forms are to include plural forms unless the context clearly indicates otherwise.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In this disclosure, the term "substantially" includes the meanings of completely, almost completely or to any significant degree under some applications and in accordance with those skilled in the art. The term "connected" includes an electrical connection.

FIG. 1 is a block diagram of a display device 1 according to an exemplary embodiment. Depending on embodiments, certain elements may be removed from or additional elements may be added to the display device 1 illustrated in FIG. 1. Furthermore, two or more elements may be combined into a single element, or a single element may be realized as multiple elements. This applies to the remaining apparatus embodiments.

Referring to FIG. 1, the display device 1 includes a plurality of scanning lines (S1-Sn), a plurality of data lines (D1-Dm), a display unit 100, a data driver 200, a scan driver 300, a signal controller 400, and a plurality of pixels PX.

As shown in FIG. 1, the scanning lines (S1-Sn) (n is a natural number) are arranged in a vertical or column direction and each of the scanning lines (S1-Sn) extends in a horizontal or row direction. The data lines (D1-Dm) (m is a natural number) are arranged in a horizontal or row direction and each of the data lines (D1-Dm) extends in a vertical or column direction.

The display unit 100 is connected to the scanning lines (S1-Sn), the data lines (D1-Dm), and the sensing lines (SL1-SLm). The pixels PX are substantially arranged in a matrix form.

The data driver 200 is connected to a plurality of data lines (D1-Dm). The data driver 200 generates a plurality of data signals (D[1])-D[m]) (e.g., a data voltage) corresponding to image data DATA1 input according to a data driving control signal CONT1 and applies the same to a plurality of data lines (D1-Dm).

The scan driver 300 is connected to a plurality of scanning lines (S1-Sn), and it sequentially applies a plurality of scanning signals (S[1]-S[n]) to a plurality of scanning lines (S1-Sn) according to a scan control signal CONT2.

The signal controller 400 receives external input data InD and a synchronization signal and generates a data driving control signal CONT1, a scan control signal CONT2, and image data DATA1. The external input data InD include luminance information of the pixels PX, and the luminance has a predetermined number of grays (e.g., $1024(=2^{10})$, $256(=2^8)$, or $64(=2^6)$). The synchronization signal includes a horizontal synchronizing signal Hsync, a vertical synchronization signal Vsync, and a main clock signal MCLK. The signal controller 400 distinguishes the external input data InD for respective frames according to the vertical synchronization signal Vsync. The signal controller 400 distinguishes the external input data InD for respective scan lines according to the horizontal synchronizing signal Hsync and generates the image data DATA1.

The signal controller 400 is connected to a plurality of sensing lines (SL1-SLm), and determines the degradation of the pixels PX based upon measured luminance values of the pixels PX. The signal controller 400 may generate the data driving control signal CONT1 to correct an amount of light of the degraded pixel PX.

The pixels PX respectively display an image, and more specifically, one pixel may uniquely display one primary color (spatial division), or the pixels may alternately display primary colors over time (temporal division) so that a spatial sum or a temporal sum of the primary colors may be displayed as a desired color. The pixels PX are synchronized with corresponding scanning signals and receive data signals (D[1])-D[m]) from the corresponding data lines. The data signals (D[1])-D[m]) input to the pixels PX are programmed to the pixels PX according to the scanning signals supplied through the corresponding scanning lines.

Figure 3:
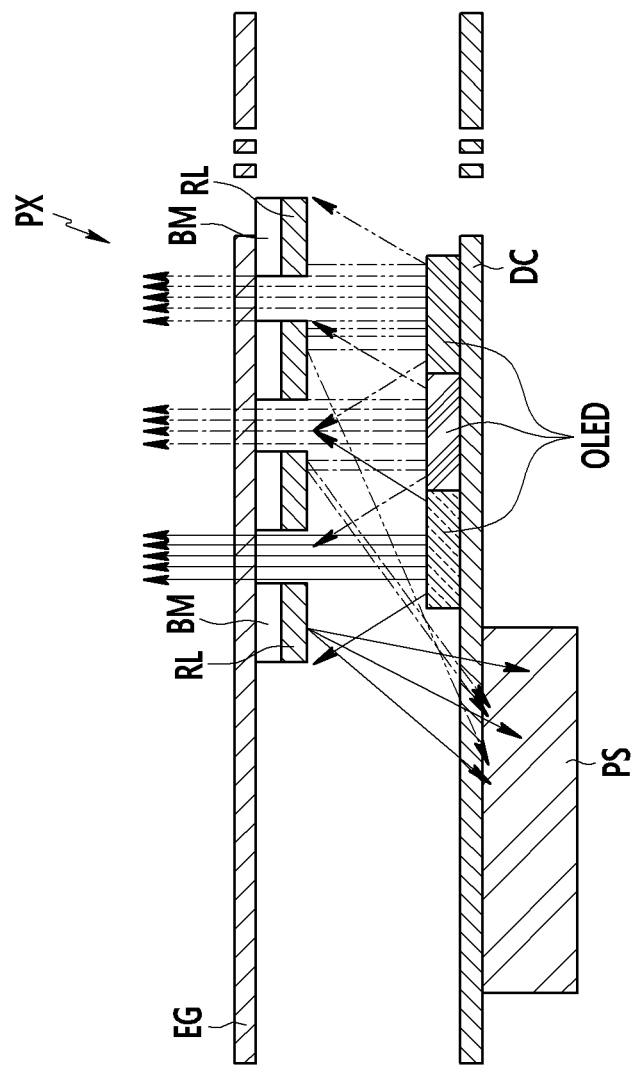
FIG. 3 shows a cross-sectional diagram of a pixel according to an exemplary embodiment.

Each of the pixels PX includes an OLED (OLED, refer to FIG. 3) and a photosensor (PS, refer to FIG. 3). A plurality of photosensors (PS) are connected to a plurality of corresponding sensing lines (SL1-SLm). The photosensors (PS) are respectively synchronized with corresponding scanning signals and measure a luminance value of light emitted by the corresponding OLED. The configuration of the pixel PX will now be described in detail.

Figure 2:
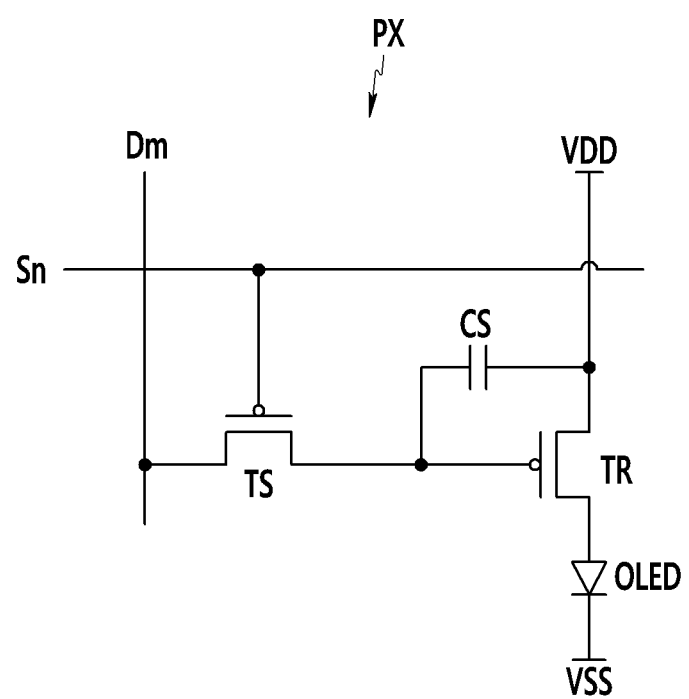
FIG. 2 shows a pixel of FIG. 1.

FIG. 2 shows the pixel PX of FIG. 1. As shown in FIG. 2, the pixel PX includes a switching transistor (TS), a driving transistor (TR), a storage capacitor (CS), and an OLED.

The switching transistor (TS) includes a gate electrode connected to the scanning line (Sn), a first electrode connected to the data line D1, and a second electrode connected to a gate electrode of the driving transistor (TR).

The driving transistor (TR) includes a gate electrode connected to the second electrode of the switching transistor (TS), a source electrode connected to a driving voltage (VDD), and a drain electrode connected to an anode of the OLED.

The storage capacitor (CS) is connected between the gate electrode and the source electrode of the driving transistor (TR).

The OLED includes a cathode connected to a driving voltage (VSS).

When the switching transistor (TS) is turned on by the scanning signal with a gate-on voltage transmitted through the scanning line S1, the data signal is transmitted to the gate electrode of the driving transistor (TR) through the switching transistor (TS). A voltage caused by the data signal transmitted to the gate electrode of the driving transistor (TR) is maintained by the storage capacitor (CS).

A driving current corresponding to the voltage maintained by the storage capacitor (CS) flows to the driving transistor (TR). The driving current flows to the OLED, and the OLED emits light with a luminance corresponding to the driving current.

FIG. 3 shows a cross-sectional diagram of a pixel according to an exemplary embodiment. FIG. 3 shows the display unit 100 according to an exemplary embodiment with a configuration of a front emissive display device.

For ease of description, FIG. 3 shows that one photosensor (PS) is formed corresponding to one OLED, but the exemplary embodiment is not limited thereto, and one photosensor (PS) may be formed corresponding to a plurality of OLEDs.

The respective pixels PX include an encapsulation glass (EG) or a glass encapsulation, and a driving circuit layer (DC) formed to face the encapsulation glass (EG). A black matrix (BM) is provided on a lower portion of the encapsulation glass (EG), and a reflection layer (RL) is provided on the black matrix (BM). The OLED is provided on the driving circuit layer (DC), and the photosensor (PS) is formed in a position that does not overlap the OLED on a lower portion of the driving circuit layer (DC).

The driving circuit layer (DC) includes a pixel circuit (refer to FIG. 2) for generating a driving current corresponding to the data signal input to the pixels PX and a plurality of electrodes (not shown) for transmitting the generated driving current to the OLED.

The OLED emits light with a luminance corresponding to the driving current. The light emitted by the OLED may be output to the front side through the encapsulation glass (EG). The light emitted by the OLED is reflected on the reflection layer (RL) and reaches the photosensor (PS), and the reflection layer (RL) may increase the amount of light output to the rear side.

The black matrix (BM) blocks undesired light when the image is realized by using the light (e.g., red, green and blue light) emitted by the OLED. The photosensor (PS) senses the luminance of light emitted by the OLED.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the above detailed description is not to be interpreted as being restrictive, but is to be considered as being illustrative. The scope of the present invention is to be determined by reasonable interpretation of the claims, and all alterations within equivalences of the present invention fall within the scope of the present invention.

What is claimed is:

1. A pixel comprising:
   an organic light-emitting diode (OLED);
   a reflection layer facing the OLED and configured to reflect light emitted from the OLED;
   photosensor configured to measure luminance of the reflected light; and
   a black matrix formed between an encapsulation glass layer and the reflection layer,
   wherein the black matrix and the reflection layer have substantially the same width and substantially completely overlap each other in the depth dimension of the panel,
   wherein the photosensor is placed on a rear side of the OLED, wherein the photosensor and the OLED do not overlap each other in the depth dimension of the pixel, wherein the photosensor and only a partial portion of the reflection layer overlap each other in the depth dimension of the pixel, and wherein the black matrix has a bottom surface facing the OLED, and wherein the reflection layer contacts only the bottom surface of the black matrix, and is configured to amplify an amount of light output to the rear side of the OLED.

2. The pixel of claim 1,
wherein the Mack matrix is arranged on a lower portion of the encapsulation glass layer, and
wherein the photosensor is placed on a lower portion of the black matrix.

3. The pixel of claim 2, wherein the photosensor partially overlaps the black matrix in the depth dimension of the pixel.

4. The pixel of claim 2, wherein the photosensor is thicker than the black matrix.

5. The pixel of claim 1, wherein the photosensor is thicker than the reflection layer.

6. The pixel of claim 1, wherein the photosensor is thicker than the OLED.

7. The pixel of claim 1, further comprising a driving circuit layer formed below the OLED and formed over the photosensor.

8. The pixel of claim 7, wherein the photosensor is configured to sense light emitted from the OLED and passing through the driving circuit layer.

9. The pixel of claim 7, wherein the photosensor is thicker than the driving circuit layer.

10. A display device, comprising:
a plurality of pixels, wherein each of the pixels includes:
an organic light-emitting diode (OLED);
a reflection layer facing the OLED and configured to reflect light emitted from the OLED;
a photosensor configured to measure luminance of the reflected light; and
a black matrix formed between an encapsulation glass layer and the reflection layer,
wherein the black matrix and the reflection layer have substantially the same width and substantially completely overlap each other in the depth dimension of the panel,
wherein the photosensor is placed on a rear side of the OLED,
wherein the photosensor and the OLED do not overlap each other in the depth dimension of the pixel,
wherein the photosensor and only a partial portion of the reflection layer overlap each other in the depth dimension of the pixel, and
wherein the black matrix has a bottom surface facing the OLED, and wherein the reflection layer contacts only the bottom surface, of the black matrix, and is configured to amplify an amount of light output to the rear side of the OLED.

11. The display device of claim 8,
wherein the black matrix is arranged on a lower portion of the encapsulation glass layer, and
wherein the photosensor is placed on a lower portion of the Hack matrix.

12. The display device of claim 11, further comprising:
a data driver configured to generate a plurality of data signals according to a control signal; and
a signal controller configured to generate the control signal,
wherein the OLED is configured to emit light according to a driving current corresponding to the data signals, and
wherein the signal controller is further configured to determine degradation of the OLED based upon a luminance value of the reflected light, and generate the control signal to correct an amount of light of the degraded OLED.

13. The display device of claim 10, wherein the photosensor partially overlaps the black matrix in the depth dimension of the pixel.

14. The display device of claim 10, further comprising a driving circuit layer formed below the OLED and formed over the photosensor, wherein the photosensor is configured to sense light emitted from the OLED and passing through the driving circuit layer.

15. A pixel comprising:
a driving circuit layer including first and second surfaces opposing each other;
an organic light-emitting diode (OLED) formed on the first surface of the driving circuit layer;
a reflection layer formed over the OLED and configured to reflect light emitted from the OLED;
a photosensor placed on the second surface of the driving circuit layer and configured to measure luminance of the reflected light; and
a black matrix formed between an encapsulation glass layer and the reflection layer,
wherein the black matrix and the reflection layer have substantially the same width and substantially completely overlap each other in the depth dimension of the panel,
wherein the photosensor and the OLED do not overlap each other in the depth dimension of the pixel,
wherein the photosensor and only a partial portion of the reflection layer overlap each other in the depth dimension of the pixel, and
wherein the black matrix has a bottom surface facing the OLED, and wherein the reflection layer contacts only the bottom surface of the black matrix, and is configured to amplify an amount of light output to a rear side of the OLED.

16. The pixel of claim 1, wherein the black matrix and the reflection layer are formed on different layers.

* * * * *